United States Patent
Bauer et al.

(10) Patent No.: US 12,205,880 B2
(45) Date of Patent: Jan. 21, 2025

(54) ELECTRONIC DEVICE AND MULTI-LEVEL INTERPOSER WITH RF SLOPED VIA AND RELATED METHOD

(71) Applicant: Eagle Technology, LLC, Melbourne, FL (US)

(72) Inventors: Matt Bauer, Melbourne, FL (US); Timothy Clingenpeel, Melbourne, FL (US); Beatriz Jimenez, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 381 days.

(21) Appl. No.: 17/655,610

(22) Filed: Mar. 21, 2022

(65) Prior Publication Data

US 2023/0298988 A1    Sep. 21, 2023

(51) Int. Cl.
*H01L 23/498* (2006.01)
*H01L 21/48* (2006.01)
*H01L 23/66* (2006.01)

(52) U.S. Cl.
CPC .... *H01L 23/49838* (2013.01); *H01L 21/4857* (2013.01); *H01L 21/486* (2013.01); *H01L 23/49816* (2013.01); *H01L 23/49822* (2013.01); *H01L 23/66* (2013.01); *H01L 2223/6616* (2013.01); *H01L 2223/6627* (2013.01)

(58) Field of Classification Search
CPC ......... H01L 21/4857; H01L 2223/6616; H01L 2223/6627
See application file for complete search history.

(56) References Cited

U.S. PATENT DOCUMENTS

| | | |
|---|---|---|
| 6,215,377 B1 | 4/2001 | Douriet |
| 6,606,305 B1 | 8/2003 | Boyle et al. |
| 8,829,659 B2 | 9/2014 | Sun et al. |
| 9,263,503 B2 | 2/2016 | Yamazaki et al. |
| 10,439,013 B2 | 10/2019 | Striakhilev et al. |
| 2011/0228918 A1 | 9/2011 | Ayers et al. |
| 2017/0290212 A1 | 10/2017 | Palaniswamy et al. |

(Continued)

FOREIGN PATENT DOCUMENTS

WO    WO2016064813    4/2016

OTHER PUBLICATIONS

Seo et al. "Enhancement of differential signal integrity by employing a novel face via structure" IEEE Transactions on Electromagnetic Compatibility; 2018; 60(1), 26-33.

(Continued)

*Primary Examiner* — Jay C Kim
*Assistant Examiner* — Woo K Lee
(74) *Attorney, Agent, or Firm* — ALLEN, DYER, DOPPELT, GILCHRIST, P.A.

(57) ABSTRACT

An electronic device may include an IC, a grid array substrate, and a multi-level interposer coupled between the IC and the grid array substrate. The multi-level interposer may have dielectric layers, and a sequence of metal levels carried by respective dielectric layers, and an RF sloped via including a sloped metal signal layer extending from a first metal level, through a second metal level, and to a third metal level, and a respective sloped lateral metal ground layer adjacent each side of the sloped metal signal layer.

18 Claims, 10 Drawing Sheets

(56) References Cited

U.S. PATENT DOCUMENTS

2022/0122898 A1\* 4/2022 Chen ................. H01L 21/6836

OTHER PUBLICATIONS

Lie et al. "VLSI macromodeling and signal integrity analysis via digital signal processing techniques" (IMECS 2011) In Proceedings of the International MultiConference of Engineers and Computer Scientists 2011; pp. 2.

Ziv Cohen "How 3D Printing PCBS Aids Impedance Controlled Routing"https://www.nano-di.com/blog/2020-how-3d-printing-pcbs-aids-impedance-controlled-routing: Mar. 10, 2020; pp. 6.

\* cited by examiner

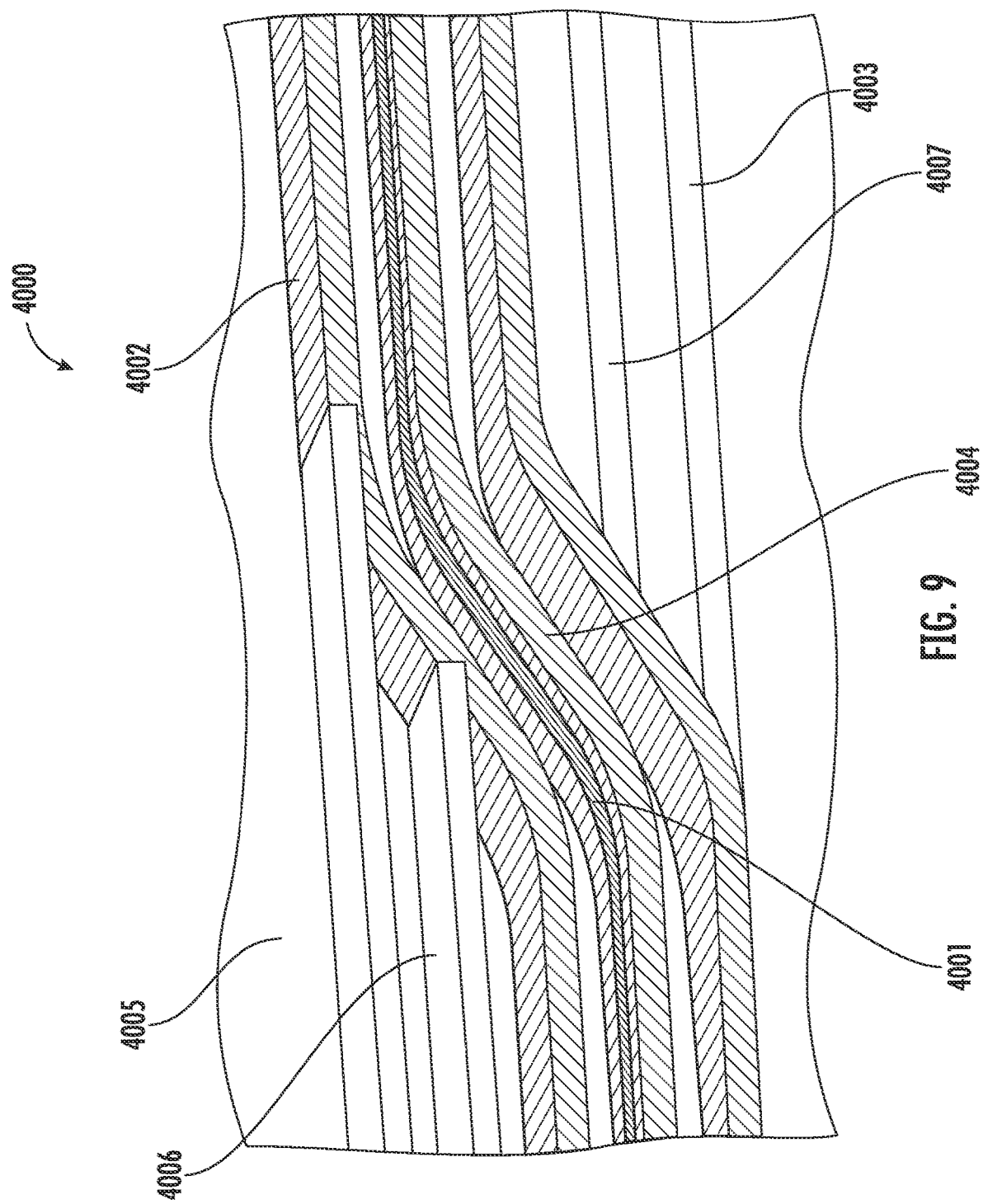

ELECTRONIC DEVICE AND MULTI-LEVEL INTERPOSER WITH RF SLOPED VIA AND RELATED METHOD

TECHNICAL FIELD

The present disclosure relates to the field of electronic devices, and, more particularly, to connectors between electronic devices and related methods.

Background

An electronic device may include one or more circuit card modules inserted into a chassis and electronically coupled to a backplane of the electronic device. A typical circuit card module includes one or more circuit boards mounted to a heat sink structure. A typical circuit board is a planar board that mechanically supports electronic components. The electronic components may comprise, for example, resistors, capacitors, switches, batteries, and other more complex integrated circuit components, i.e. microprocessors. The circuit board typically comprises a dielectric material.

As capability requirements and lower size weight and power (SWaP) is required, the resolution of printed circuit board technology is pushed to its limits. Additionally, both heterogeneous substrate requirements and yield issues with processing larger die preclude super die approaches from being used to meet these demands in many systems.

This has pushed the industry to adopt a chiplet based approach where multiple individual chiplets are fabricated, such as analog circuits, processors, small antenna, memory, etc. on individual small chips. These chips are then electrically interfaced with a silicon or glass interposer where dielectric and metal routing are produced with back end of the line wafer level processing techniques.

Such wafer level processing metallization has significantly greater routing density than printed circuit board technology. Additionally it has significantly higher yield than processing a large system on chip where the whole system is on a single die. This is because the loss of yield is generally in front end of line processes, such as doping rather than the back end metallization, and individual die chiplets be checked for performance before assembly onto the interposer.

In applications operating in the Extremely high frequency (EHF) range (also referred to as millimeter wave, or mmWave), which comprises 30-300 GHz, it is typical to minimize the number of layers, use traditional via structures, and utilize coplanar waveguides. In some approaches involving printed circuit boards in place of silicon or glass interposers, "face via" structures have been used to lessen the loss impact of layer-to-layer transitions. However, with higher frequencies, the limitations of these approaches may be an issue.

SUMMARY

Generally, an electronic device may include at least one integrated circuit (IC), a grid array substrate, and a multi-level interposer coupled between the at least one IC and the grid array substrate. The multi-level interposer may include a plurality of dielectric layers, and a sequence of metal levels carried by respective dielectric layers, and a radio frequency (RF) sloped via (i.e. where the lead in and the lead out of the slope is curved) comprising a sloped metal signal layer extending from a first metal level, through a second metal level, and to a third metal level, and a respective sloped and curved lateral metal ground layer adjacent each side of the sloped metal signal layer.

More specifically, the RF sloped via may include a sloped upper metal ground layer above the sloped metal signal layer, and a sloped lower metal ground layer below the sloped metal signal layer. Outer edges of the sloped upper metal ground layer and the sloped lower metal ground layer may be aligned with one another. Further, outer edges of the sloped upper metal ground layer and the sloped lower metal ground layer may be aligned with one another and with outer edges of the sloped lateral metal ground layers.

For example, the sloped metal signal layer may have a slope angle in a range of 10°-80° or 20°-50° between a normal of a major surface of the multi-level interposer and a normal from a sloped portion of the sloped metal signal layer. The sloped metal signal layer and the respective sloped lateral metal ground layers may be coplanar. The multi-level interposer may comprise a plurality of contacts carried by an uppermost dielectric layer and coupled to the at least one IC. For example, the RF sloped via may be operable at a frequency above 24 GHz.

Another aspect is directed to a multi-level interposer to be coupled between at least one IC and a grid array substrate. The multi-level interposer may include a plurality of dielectric layers, and a sequence of metal levels carried by respective dielectric layers, and one or more layers of RF sloped via(s) through an interposer. The RF sloped via(s) may comprise a sloped metal signal layer extending from a first metal level, through a second metal level, and to a third metal level, and a respective sloped lateral metal ground layer adjacent each side of the sloped metal signal layer.

Yet another aspect is directed to a method for making a multi-level interposer to be coupled between at least one IC and a grid array substrate. The method may include forming a plurality of dielectric layers, and a sequence of metal levels carried by respective dielectric layers, and forming one or more RF sloped via(s) through an interposer. The RF sloped via may include a sloped metal signal layer extending from a first metal level, through a second metal level, and to a third metal level, and a respective sloped lateral metal ground layer adjacent each side of the sloped metal signal layer.

BRIEF DESCRIPTION OF THE DRAWINGS

FIG. 9 is another schematic perspective view of the RF sloped via from the electronic device of FIG. 1 with the dielectric layers removed.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Referring initially to FIGS. 1-4, an electronic device 100 according to the present disclosure is now described. The electronic device 100 illustratively comprises a plurality of ICs 101a-101b, a grid array substrate 102, and a multi-level interposer 103 coupled between the plurality of ICs and the grid array substrate.

The multi-level interposer 103 includes a plurality of dielectric layers 104a-104g, and a sequence of metal levels 105a-105g (L0-L4 in FIG. 5) carried by respective dielectric layers. For example, each of the plurality of dielectric layers 104a-104 g may comprise a $SiO_2$ dielectric material, and each of the sequence of metal levels 105a-105g may comprise at least one of copper, silver, gold, aluminum, or alternative conductor. For drawing clarity, the multi-level interposer 103 comprises five metal levels, but it should be appreciated that the multi-level interposer 103 may comprise more or less layers depending on the application.

Figure 5:
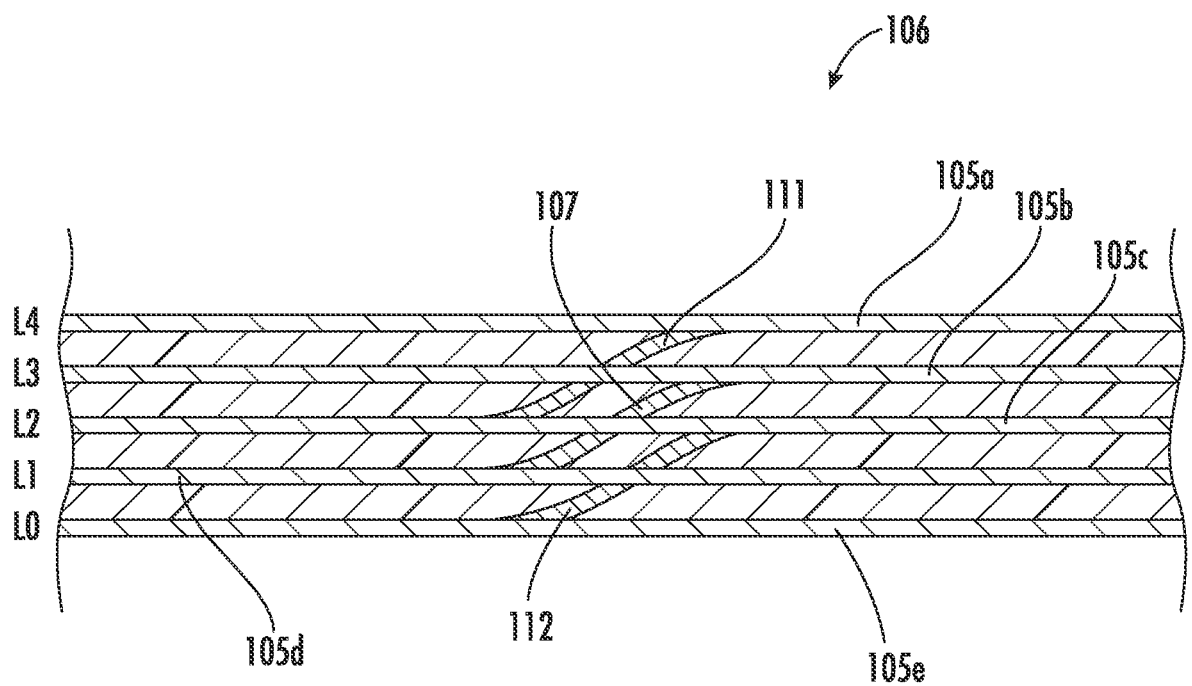
FIG. 5 is a schematic cross-sectional view of the RF sloped via of FIG. 4 along line 5-5.

As perhaps best seen in FIG. 5, the middle five metal levels of the multi-level interposer 103 are shown. The multi-level interposer 103 includes a plurality of RF sloped vias 106a-106c, each RF sloped via comprising a sloped metal signal layer 107 extending from a first metal level (L3) from the sequence of metal levels 105a-105g, through a second metal level (L2) from the sequence of metal levels, and to a third metal level (L1) from the sequence of metal levels. The multi-level interposer 103 further includes a respective sloped lateral metal ground layer 110a-110b adjacent each side of the sloped metal signal layer 107, i.e. flanking the sloped metal signal layer.

In each of the plurality of RF sloped vias 106a-106c, the signal (in the sloped metal signal layer 107) "sees" ground approximately equidistant throughout the level transition from one metal layer to another (L3 to L1). However, this surrounding ground separates from one layer's ground plane and stitches to the next. Referring briefly and additionally to FIG. 9, at the point where the sloped metal reaches the above metal plane, it merges and electrically connects to the plane. Similarly, the ground plane below the signal trace is connected to the rest of the ground plane on this level before it begins to curve upward. On the sides of the signal, the coplanar waveguide ground, generally extending a multiple of 2 or 3 times the distance between the signal and the ground plane, moves with the signal. However, without loss of generality, this distance may be altered depending on the balance of signal density and impedance control required for a particular application. Beyond this distance, the standard parallel ground layers exists and so the curved co-planar waveguide connects with them at each layer. This stitching is shown in diagram 4000 with the signal trace 4001, an upper ground plane 4002, a lower ground plane 4003, and a coplanar waveguide ground 4004. This diagram 4000 illustratively comprises planar grounds 4005-4006 & 4003, 4007.

Since this is the ground stitching "sufficiently far" from the sloped metal signal, this will not impact the impedance of the sloped metal signal. The signal can then loop around on the upper plane arbitrarily allowing similar design routing flexibility to via structures.

Each of the plurality of RF sloped vias 106a-106c illustratively includes a sloped upper metal ground layer 111 above the sloped metal signal layer 107, and a sloped lower metal ground layer 112 below the sloped metal signal layer. As perhaps best seen in FIG. 2, outer edges of the sloped upper metal ground layer 111 and the sloped lower metal ground layer 112 are aligned with one another. Further, outer edges of the sloped upper metal ground layer 111 and the sloped lower metal ground layer 112 are additionally illustratively aligned with outer edges of the sloped lateral metal ground layers 110a-110b.

Figure 6:
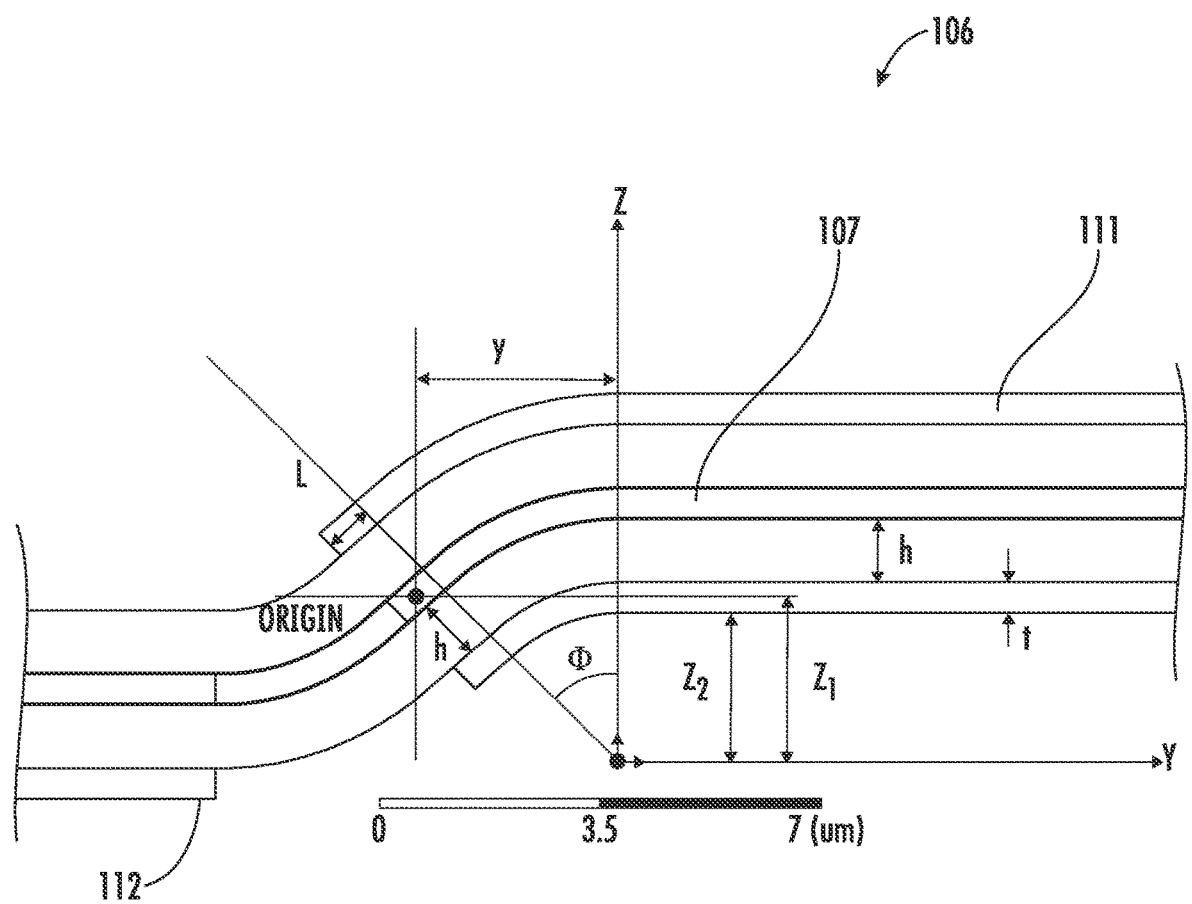
FIG. 6 is a schematic diagram of the RF sloped via from the electronic device of FIG. 1 with some metal layers removed.

Referring now to FIG. 6, the sloped metal signal layer 107 may have a slope angle ($\phi$) in a range of 10°-80° between a normal of a major surface of the multi-level interposer 103 and a normal from a sloped portion of the sloped metal signal layer. In some advantageous embodiments, the sloped metal signal layer 107 may have a slope angle in a range of 20°-50°. The length of the sloped metal signal layer 107 (L) is determined based upon formula 1 herein:

$$L = 2\sqrt{(h+t)^2 + c^2} - 2\left(\frac{b}{\tan\frac{\varphi}{2}} + h + t\right)\tan\frac{\varphi}{2} - t\tan\frac{\varphi}{2}; \quad (1)$$

where $$c = (h+t)\tan\left(\frac{\pi}{2} - \varphi\right);$$

$$y = c + \frac{3t}{2}\tan\frac{\varphi}{2} + h\tan\frac{\varphi}{2} + b;$$

$$z_1 = -b\tan\frac{\varphi}{2} - \frac{t}{2};$$

Also, b=1 μm, chosen to allow $\varphi$=45-30 degrees, longer recommended below 30°;

$$z_2 = z_1 - \frac{t}{2};$$

y is the horizontal distance from the center of a sloped portion to the edge of the slope; $z_2$ is the vertical distance from the intersection of the two aforementioned normal vectors to the uppermost ground layer beneath the signal layer; $z_1$ is the vertical distance from the intersection of the two aforementioned normal vectors to a horizontal line intersecting the center of the sloped portion (or $z_2$ plus half the conductor thickness); and t and h are conductor and dielectric thickness, respectively. Use of formula 1 allows for the design of a smooth slope transition regardless of slope angle ($\phi$.

Figure 1:
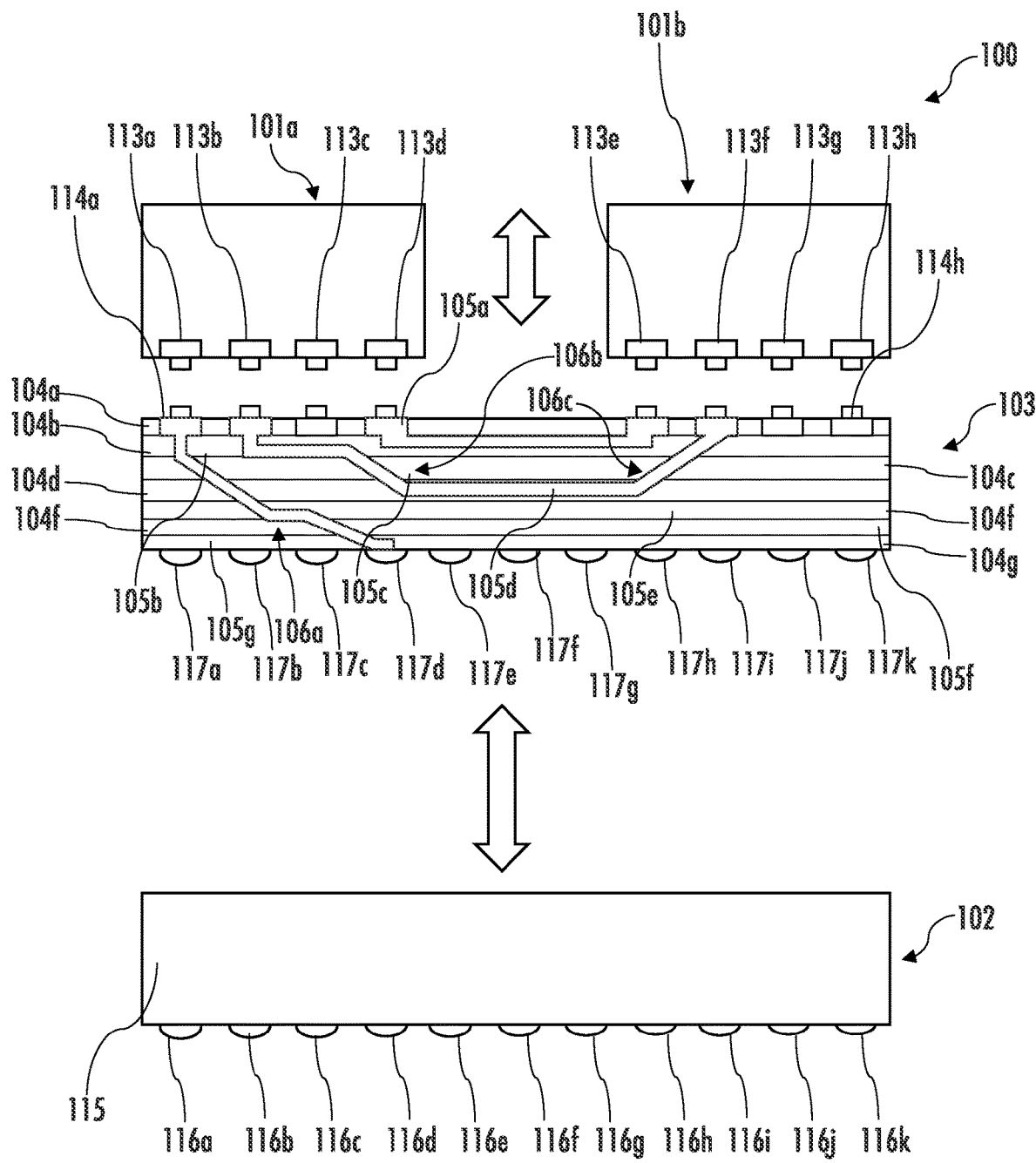
FIG. 1 is a schematic side view of an electronic device, according to the present disclosure.
Figure 2:
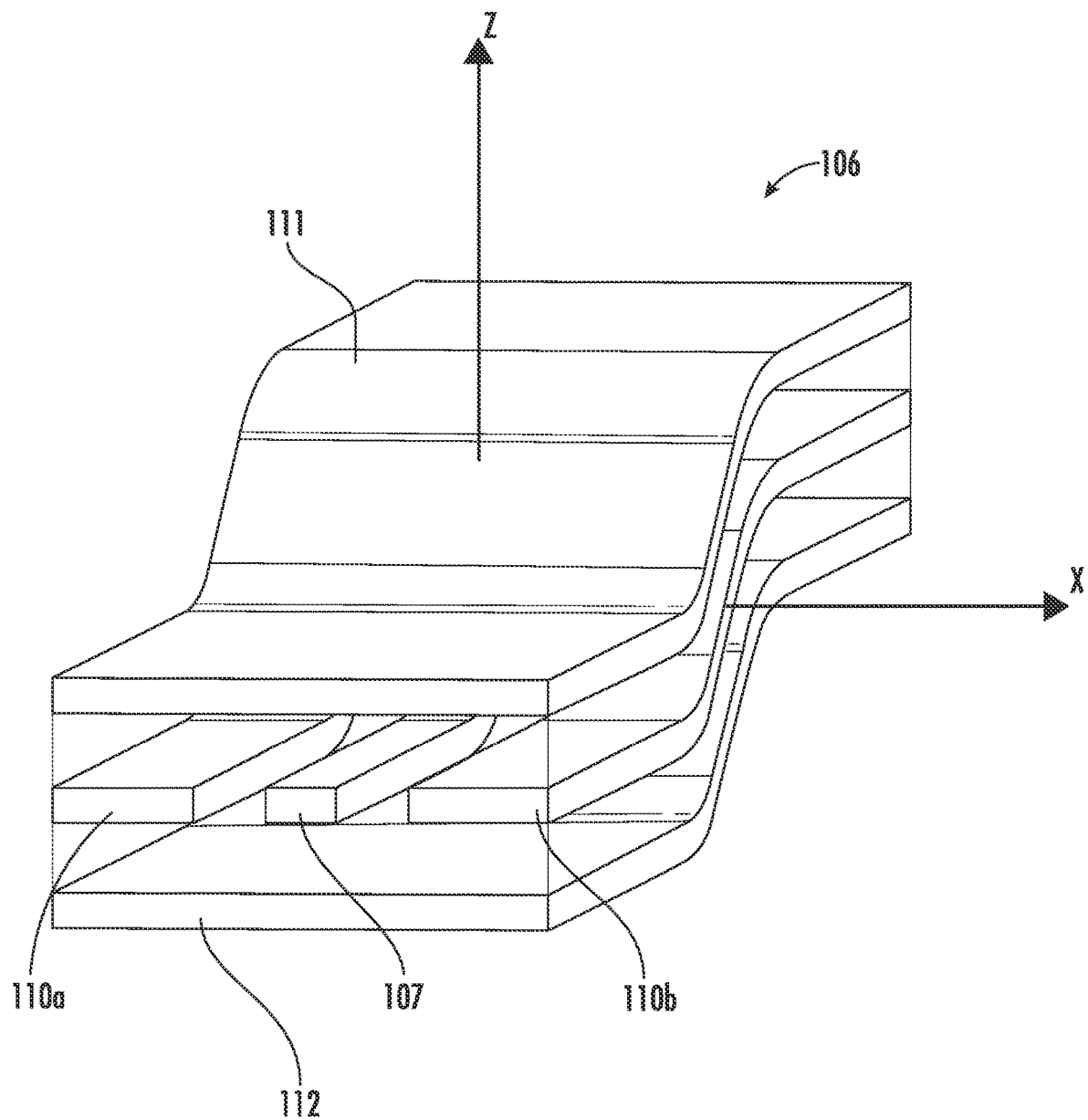
FIG. 2 is a schematic perspective view of an RF sloped via from the electronic device of FIG. 1 with the dielectric layers removed.
Figure 3:
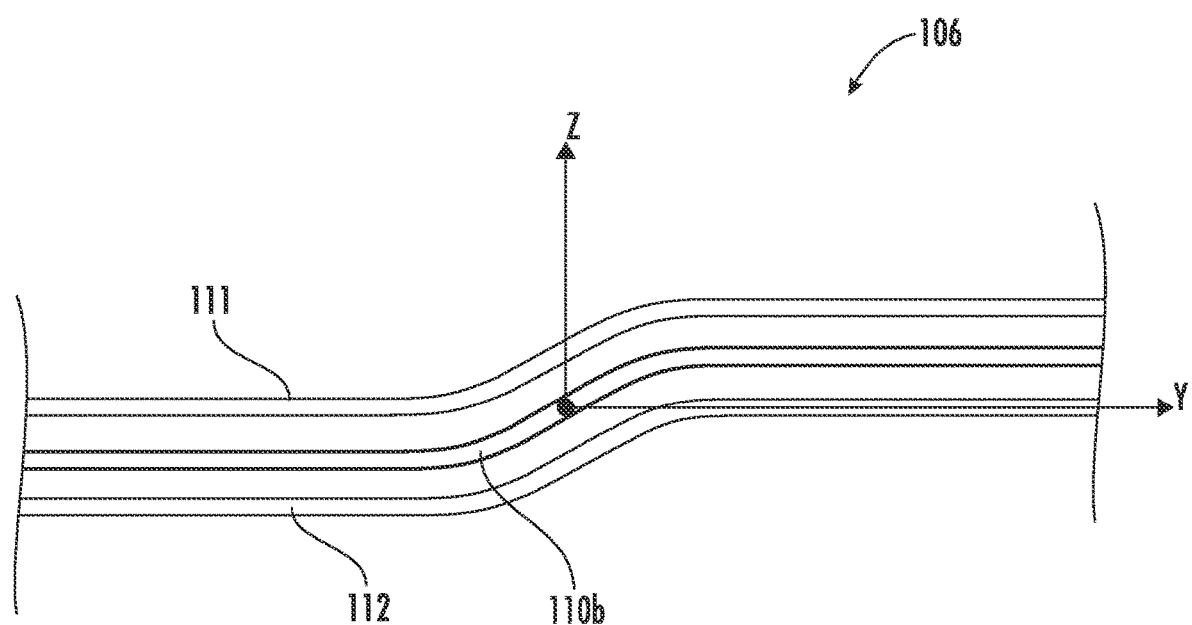
FIG. 3 is a schematic side view of the RF sloped via from the electronic device of FIG. 1.
Figure 4:
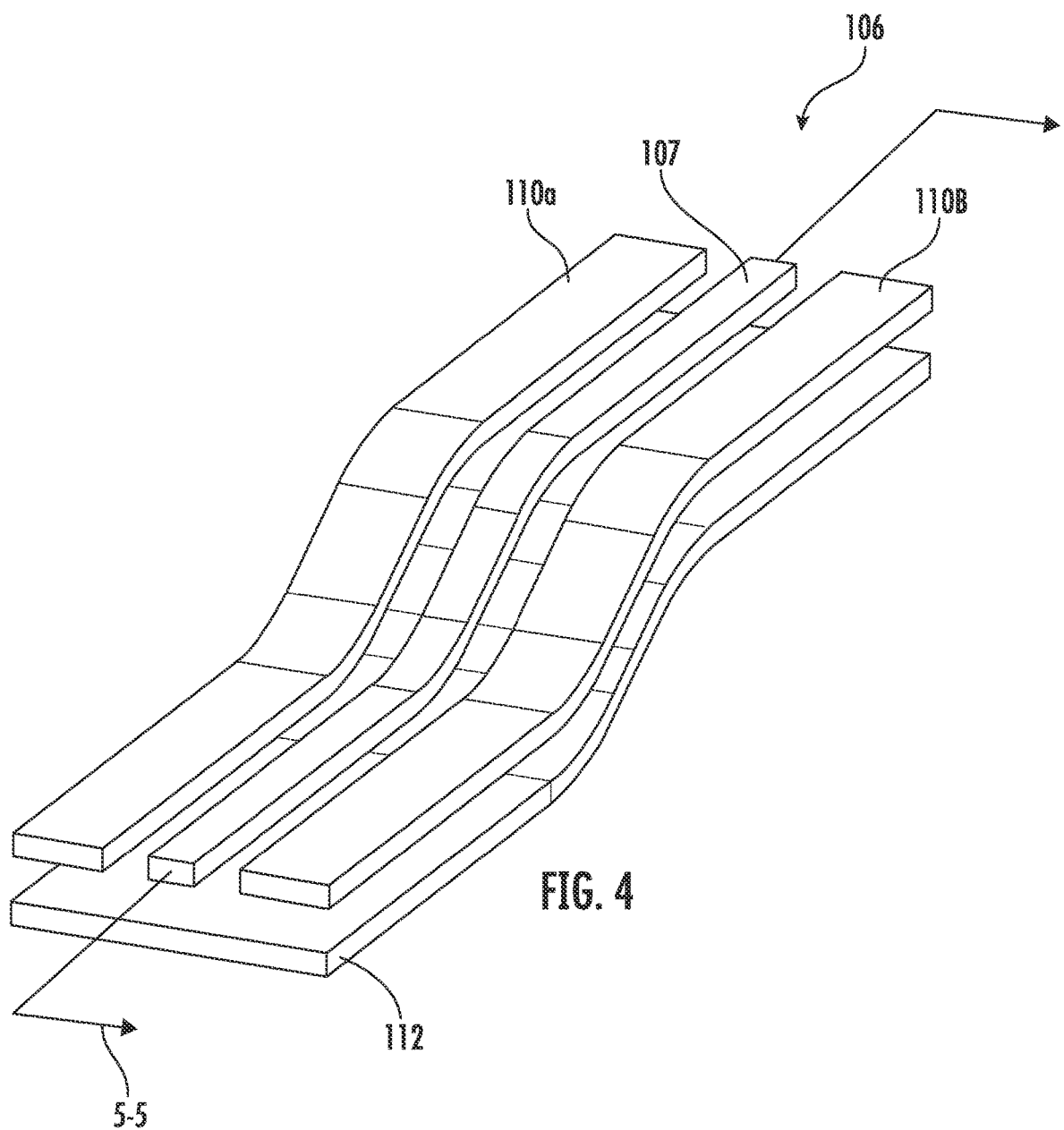
FIG. 4 is a schematic perspective view of the RF sloped via from the electronic device of FIG. 1 with a sloped upper metal ground layer removed with the dielectric layers removed.

As perhaps best seen in FIGS. 2-3, the sloped metal signal layer 107 and the respective sloped lateral metal ground layers 110a-110b are coplanar. The sloped lateral metal ground layers 110a-110b serve as waveguides to surround the sloped metal signal layer 107 as it slopes. Also, the sloped upper metal ground layer 111, the sloped lower metal ground layer 112, the sloped lateral metal ground layers 110a-110b, and the sloped metal signal layer 107 all have the same shape. In particular, each has a first upper portion that is planar, a second lower portion that is planar, and a sloped portion between the first upper portion and the second lower portion.

In other words, the vertical spacing between the sloped metal signal layer 107 and the sloped upper metal ground layer 111 is constant within the plurality of RF sloped vias 106a-106c. Also, the vertical spacing between the sloped metal signal layer 107 and the sloped lower metal ground layer 112 is constant within the plurality of RF sloped vias 106a-106c. Moreover, the lateral spacing between the sloped metal signal layer 107 and the respective sloped lateral metal ground layers 110a-110b is constant within the plurality of RF sloped vias 106a-106c. Also, the thickness values for the sloped metal signal layer 107, the respective sloped lateral metal ground layers 110a-110b, the sloped upper metal ground layer 111, and the sloped lower metal ground layer 112 are identical. Also, the respective thickness is constant within the plurality of RF sloped vias 106a-106c.

Each of the plurality of ICs 101a-101b illustratively includes a plurality of bond pads 113a-113h. The multi-level interposer 103 illustratively comprises a first plurality of contacts carried 114a-114h by an uppermost dielectric layer 104a and respectively coupled to the plurality of bond pads 113a-113h of the plurality of ICs 101a-101b, and a plurality of grid contacts carried 117a-117k by a lowermost dielectric layer 104g and coupled to the grid array substrate 102. The grid array substrate 102 illustratively comprises a dielectric substrate 115, and a plurality of grid contacts 116a-116k carried by the dielectric substrate. Each of the plurality of grid contacts 116a-116k and the plurality of grid contacts 117a-117k may comprise a land grid array contact or a ball grid array contact, for example.

Yet another aspect is directed to a method for making a multi-level interposer 103 to be coupled between a plurality of ICs 101a-101b and a grid array substrate 102. The method includes forming a plurality of dielectric layers 104a-104g, and a sequence of metal levels carried by respective dielectric layers, and forming an RF sloped via 106a-106c comprising a sloped metal signal layer 107 extending from a first metal level (L3), through a second metal level (L2), and to a third metal level (L1), and a respective sloped lateral metal ground layer 110a-110b adjacent each side of the sloped metal signal layer.

In some embodiments, the method may comprise forming the plurality of dielectric layers 104a-104g via an oxide deposition step. The method may comprise, for example, a grayscale lithography step, a pattern transfer via reactive ion etching step, and a photoresist removal and metal patterning step. These steps would be repeated as necessary to form the RF sloped via 106a-106c.

In some applications, the RF sloped via 106 may be operable at a frequency above 24 GHz (i.e. EHF or mmWave). In typical EHF and high bandwidth applications, impedance discontinuities may be an issue for signal integrity. As noted hereinabove, there are some existing approaches, but, at higher frequencies, the existing approaches may have limitations in terms of signal integrity and number of layers that can be employed while maintaining sufficient signal integrity.

In the RF sloped via 106a-106c, a co-planar waveguide is provided that slopes up from one layer to the next, maintaining continuous impedance and significantly decreasing insertion loss when compared to typical 90° via structures. In particular, the insertion loss at high mmWave could be improved by up to 7% for a single layer-to-layer connection. More layer-to-layer connections may be useful for mmWave signals when used in antenna arrays as spatial processing gains have been proposed to compensate for losses during transmission. For example, for five-layer connections, one of the many phased array antennas could see an insertion loss performance benefit of: $1-(1-0.07)^5 \approx 30\%$. A return loss improvement of ~10× or ~100× may be generated. On other words, the RF sloped via 106a-106c has a factor of 10 to 100 less signal returning to the source compared to typical via structures, thereby improving efficiency. Advantageously, the RF sloped via 106a-106c may provide an approach for layer-to-layer transitions with low losses, even in mmWave applications.

Figure 7A:
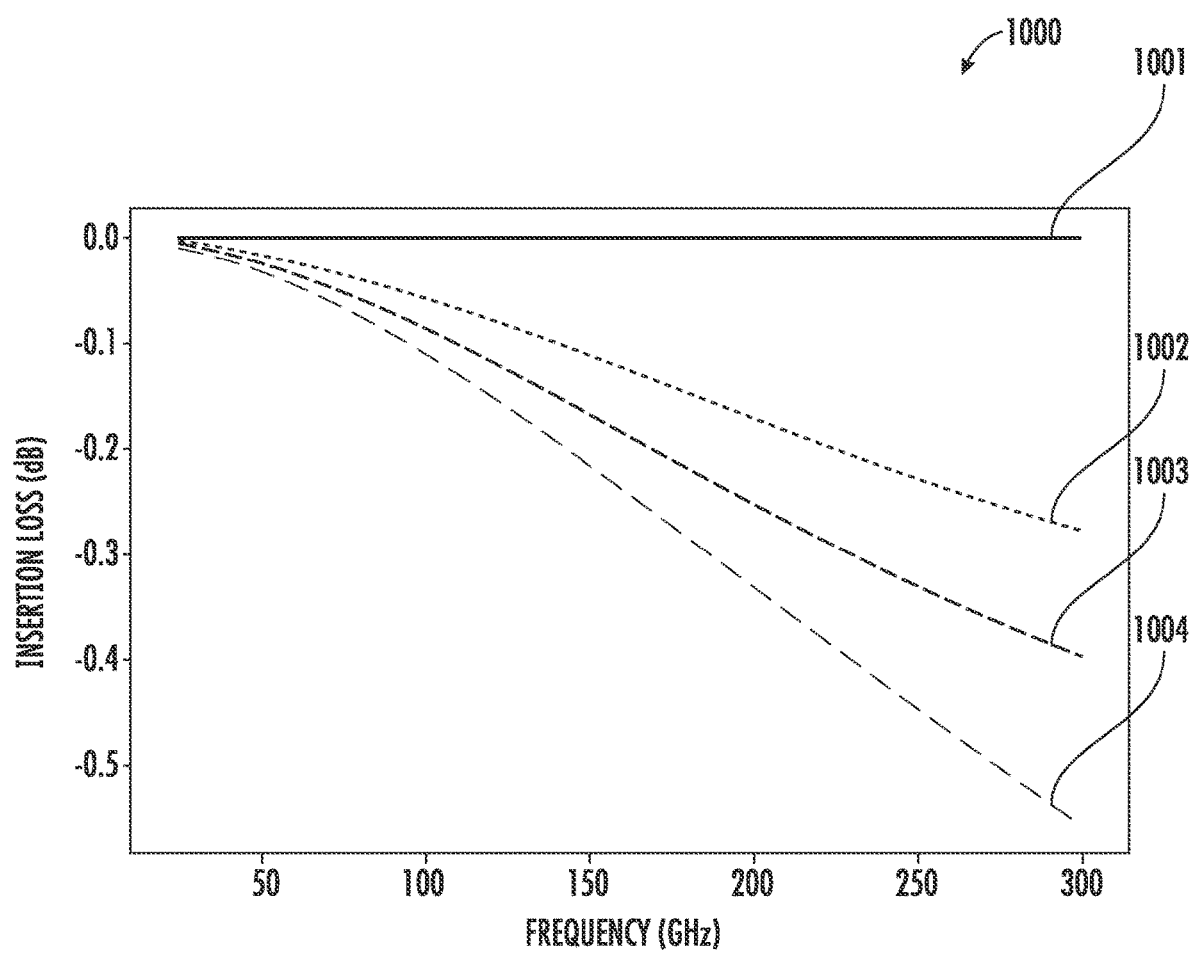
FIGS. 7A-7B are diagrams of insertion loss in the electronic device of FIG. 1.
Figure 7B:
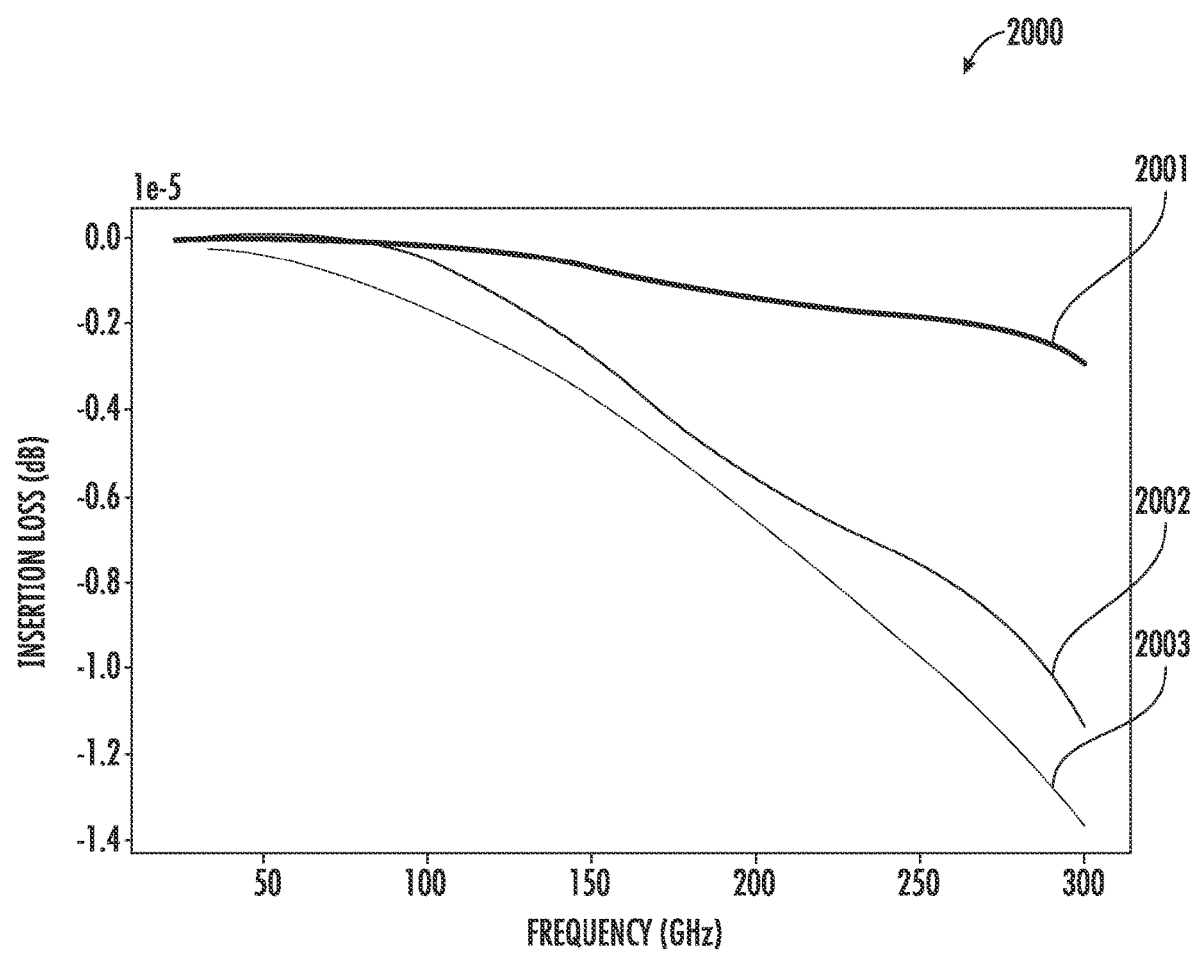
Figure 8:
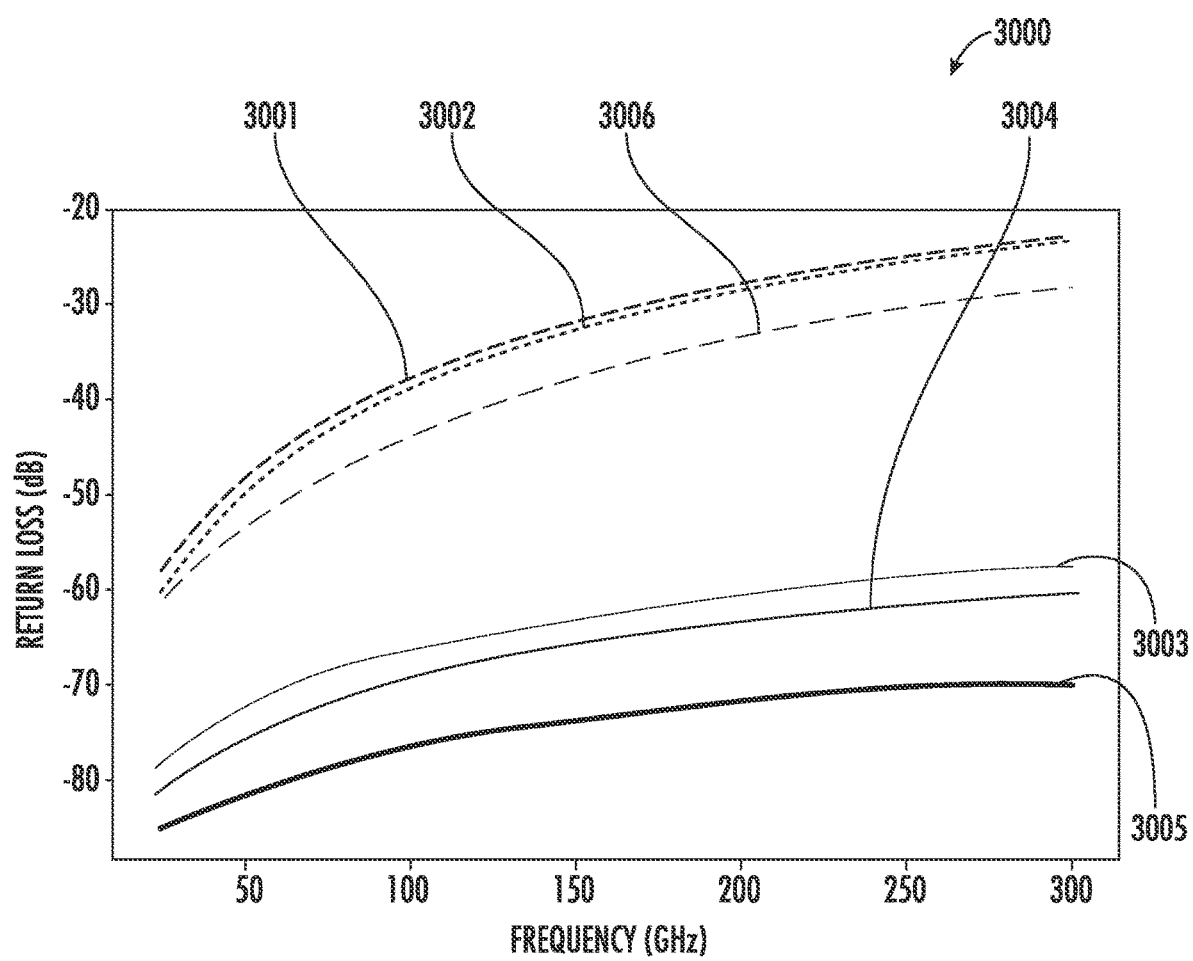
FIG. 8 is a diagram of return loss in the electronic device of FIG. 1.

Referring now additionally to FIGS. 7A-7B & 8, diagrams 1000, 2000, 3000 provide data on the performance of the RF sloped via 106a-106c. In diagrams 1000, 2000, the insertion loss of the RF sloped via 106a-106c is compared to typical via structures. In particular, curve 1001 shows insertion loss for a 25 µm slope; curve 1002 shows insertion loss for a 5 µm traditional via; curve 1003 shows insertion loss for a 10 µm traditional via; and curve 1004 shows insertion loss for a 25 µm traditional via. Further, curve 2001 shows insertion loss for a 25 µm slope; curve 2002 shows insertion loss for a 5 µm slope; and curve 2003 shows insertion loss for a 10 µm slope.

As shown, the insertion loss of the RF sloped via 106a-106c was significantly improved at mmWave frequencies (24-300 GHz). In particular, −0.5 dB→~0 dB is a 6% improvement, and 0.3 dB →4% improvement (for each traditional via replaced). This improvement shown here is per via where the multi-level interposer 103 in some applications may have several layer stacks. More layer-to-layer connections may be used for mmWave signals when used in antenna arrays as spatial processing gains have been proposed to compensate for losses during transmission.

In diagram 3000, the return loss data for the performance of the RF sloped via 106a-106c is shown. The return loss was also improved with the RF sloped via 106a-106c, giving a ~10× to ~100× improvement. This stems from a 20 to 40 dB lower return loss for the RF sloped via 106a-106c compared to a more traditional via. As stated above, this correlates to improved efficiency. For example, where a typical via structure may have 1 milliwatt returned signal power, the RF sloped via 106a-106c may have 0.1 to 0.01 milliwatts returned signal power. This translates to 0.9 to 0.99 milliwatts more power travelling through to structure from one end to the other. Importantly, this improvement may result in lower total loss when combined with the insertion loss performance. To clarify, a lower return loss means more of a signal enters a system, while a lower insertion loss means less of that signal is lost as it traverses the system. This results in lower total loss. In particular, curve 3001 shows return loss for a 25 µm traditional via; curve 3002 shows return loss for a 10 µm traditional via; curve 3003 shows return loss for a 10 µm sloped structure; curve 3004 shows return loss for a 5 µm sloped structure; curve 3005 shows return loss for a 25 µm sloped structure; and curve 3006 shows return loss for a 5 µm traditional via.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

The invention claimed is:

1. An electronic device comprising:

at least one integrated circuit (IC);
a grid array substrate; and
a multi-level interposer coupled between the at least one IC and the grid array substrate, the multi-level interposer comprising
a plurality of dielectric layers, and a sequence of metal levels carried by respective dielectric layers, and
a radio frequency (RF) sloped via comprising
a sloped metal signal layer extending from a first metal level, through a second metal level, and to a third metal level, and
a respective sloped lateral metal ground layer spaced from and adjacent each lateral side of the sloped metal signal layer in a coplanar configuration.

2. The electronic device of claim 1 wherein the RF sloped via comprises a sloped upper metal ground layer above the sloped metal signal layer, and a sloped lower metal ground layer below the sloped metal signal layer.

3. The electronic device of claim 2 wherein outer lateral edges of the sloped upper metal ground layer and the sloped lower metal ground layer are vertically aligned with one another.

4. The electronic device of claim 2 wherein outer lateral edges of the sloped upper metal ground layer and the sloped lower metal ground layer are vertically aligned with one another and with outer lateral edges of the sloped lateral metal ground layers.

5. The electronic device of claim 1 wherein the sloped metal signal layer has a slope angle in a range of 10°-80° between a normal of a major surface of the multi-level interposer and a normal from a sloped portion of the sloped metal signal layer.

6. The electronic device of claim 1 wherein the sloped metal signal layer has a slope angle in a range of 20°-50° between a normal of a major surface of the multi-level interposer and a normal from a sloped portion of the sloped metal signal layer.

7. The electronic device of claim 1 wherein the multi-level interposer comprises a plurality of contacts carried by an uppermost dielectric layer and coupled to the at least one IC.

8. The electronic device of claim 1 wherein the RF sloped via is operable at a frequency above 24 GHZ.

9. A multi-level interposer to be coupled between at least one IC and a grid array substrate, the multi-level interposer comprising:
a plurality of dielectric layers, and a sequence of metal levels carried by respective dielectric layers; and
a radio frequency (RF) sloped via comprising
a sloped metal signal layer extending from a first metal level, through a second metal level, and to a third metal level, and
a respective sloped lateral metal ground layer spaced from and adjacent each lateral side of the sloped metal signal layer in a coplanar configuration.

10. The multi-level interposer of claim 9 wherein the RF sloped via comprises a sloped upper metal ground layer above the sloped metal signal layer, and a sloped lower metal ground layer below the sloped metal signal layer.

11. The multi-level interposer of claim 10 wherein outer lateral edges of the sloped upper metal ground layer and the sloped lower metal ground layer are vertically aligned with one another.

12. The multi-level interposer of claim 10 wherein outer lateral edges of the sloped upper metal ground layer and the sloped lower metal ground layer are vertically aligned with one another and with outer lateral edges of the sloped lateral metal ground layers.

13. The multi-level interposer of claim 9 wherein the sloped metal signal layer has a slope angle in a range of 20°-50° between a normal of a major surface of the multi-level interposer and a normal from a sloped portion of the sloped metal signal layer.

14. The multi-level interposer of claim 9 further comprising a plurality of contacts carried by an uppermost dielectric layer and to be coupled to the at least one IC.

15. The multi-level interposer of claim 9 wherein the RF sloped via is operable at a frequency above 24 GHZ.

16. A method for making a multi-level interposer to be coupled between at least one IC and a grid array substrate, the method comprising:
forming a plurality of dielectric layers, and a sequence of metal levels carried by respective dielectric layers; and
forming a radio frequency (RF) sloped via comprising
a sloped metal signal layer extending from a first metal level, through a second metal level, and to a third metal level, and
a respective sloped lateral metal ground layer spaced from and adjacent each lateral side of the sloped metal signal layer in a coplanar configuration.

17. The method of claim 16 wherein the RF sloped via comprises a sloped upper metal ground layer above the sloped metal signal layer, and a sloped lower metal ground layer below the sloped metal signal layer.

18. The method of claim 17 wherein outer lateral edges of the sloped upper metal ground layer and the sloped lower metal ground layer are vertically aligned with one another.

* * * * *